United States Patent
Lee et al.

(10) Patent No.: US 7,292,014 B2
(45) Date of Patent: ***Nov. 6, 2007

(54) CONTROLLER AND LOADING SYSTEM THEREOF

(75) Inventors: Li-Min Lee, Taipei (TW); Chung-Che Yu, Taipei (TW)

(73) Assignee: Beyond Innovation Technology Co., Ltd., Taipei (TW)

( * ) Notice: Subject to any disclaimer, the term of this patent is extended or adjusted under 35 U.S.C. 154(b) by 57 days.

This patent is subject to a terminal disclaimer.

(21) Appl. No.: 11/307,131

(22) Filed: Jan. 25, 2006

(65) Prior Publication Data

US 2006/0197561 A1    Sep. 7, 2006

Related U.S. Application Data (63) Continuation-in-part of application No. 10/707,685, filed on Jan. 5, 2004, now Pat. No. 7,030,594.

(30) Foreign Application Priority Data

Nov. 14, 2003    (TW) ............................... 92131928 A (51) Int. Cl.
*G05F 1/40*    (2006.01)
*H02M 1/12*    (2006.01)

(52) U.S. Cl. .................................................. 323/266

(58) Field of Classification Search ................ 323/266, 323/268, 270, 271, 273, 275, 281, 282, 285, 323/288; 332/109, 110, 115; 327/131, 132, 327/137, 140, 172, 175, 178
See application file for complete search history.

(56) References Cited

U.S. PATENT DOCUMENTS

| | | | | |
|---|---|---|---|---|
| 4,531,096 A | * | 7/1985 | Yokoyama | 330/10 |
| 5,637,971 A | * | 6/1997 | Pratt | 318/599 |
| 5,691,628 A | * | 11/1997 | Martin | 323/237 |
| 5,703,473 A | * | 12/1997 | Phillips et al. | 323/282 |
| 5,781,423 A | * | 7/1998 | Inarida et al. | 363/41 |
| 5,793,628 A | * | 8/1998 | Koch | 363/152 |
| 6,194,875 B1 | * | 2/2001 | Takimoto et al. | 320/164 |
| 6,636,124 B1 | * | 10/2003 | Liu | 332/109 |
| 6,903,948 B2 | * | 6/2005 | Yoshida et al. | 363/95 |
| 7,202,644 B2 | * | 4/2007 | Nitta et al. | 323/259 |

FOREIGN PATENT DOCUMENTS

JP    2003-284329    10/2003

* cited by examiner

*Primary Examiner*—Matthew V. Nguyen
(74) *Attorney, Agent, or Firm*—Jianq Chyun IP Office (57) ABSTRACT

A loading system and a controller thereof are disclosed. The controller includes an adjustable triangle wave generator, an error signal generator, and a pulse signal generator. The triangle-wave generator is adapted to perform an amplitude and frequency operation according to the reference voltage and the feedback voltage for generating an amplitude-frequency adjustable triangle wave according to a variation of the feedback voltage. The error signal generator is adapted to perform an error operation according to the feedback voltage and the reference voltage for outputting an error signal. The pulse signal generator is adapted to receive and compare the error signal and the amplitude-frequency adjustable triangle wave for outputting a pulse controlling signal for the loading system.

26 Claims, 8 Drawing Sheets

CONTROLLER AND LOADING SYSTEM THEREOF

CROSS-REFERENCE TO RELATED APPLICATION

This application is a continuation-in-part of application Ser. No. 10/707,685 filed Jan. 5, 2004, now U.S. Pat. No. 7,030,594 which claims the priority benefit of Taiwan application serial no. 92131928, filed on Nov. 14, 2003. All disclosures are incorporated herewith by reference.

BACKGROUND OF THE INVENTION

1. Field of the Invention

The present invention relates to a controller, and more particularly to a controller having an adjustable triangle-wave generator for modifying the amplitude and frequency of the triangle wave, changing the width and frequency of the controlled signal and enhancing the transient response of the loading system.

2. Description of the Related Art

Pulse width modulation (PWM) is a traditional controlling method applied to a system having the feedback circuit, such as the boosting circuit, the buck circuit, the push-pull circuit, half-bridge circuit or full-bridge circuit. In the prior art technology, a feedback voltage from feedback circuit is processed by the error amplifiers to generate a error signal, and then the error signal is compared with a fixed-amplitude triangle wave generated by a triangular-wave generator as to generate a pulse.

Figure 5:
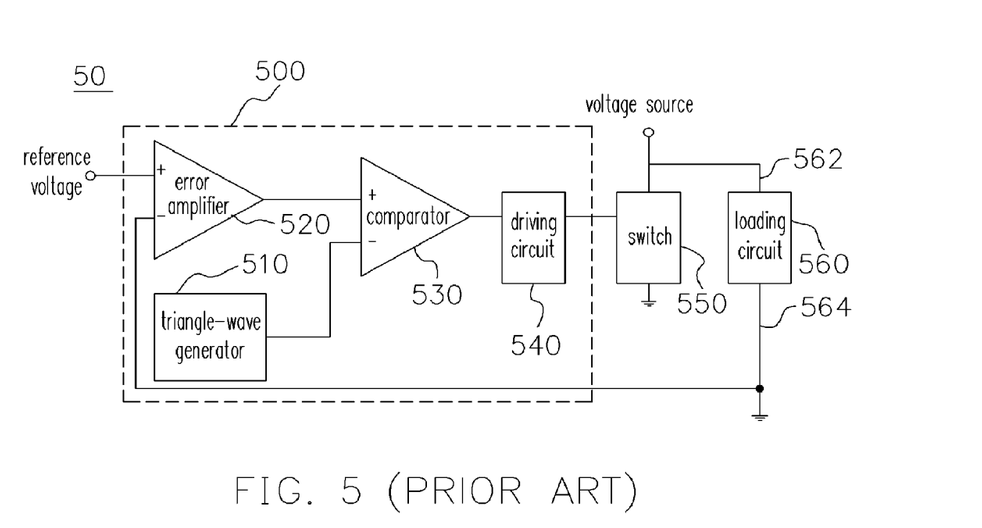
FIG. 5 is a block circuit diagram showing a conventional controller of a loading system.

FIG. 5 is a block circuit diagram showing a conventional controller of a loading system. The loading system 50 comprises: a controller 500, a switch 550 and a loading circuit 560. The switch 550 is coupled to a power terminal, the controller 500 and a ground terminal. The input terminal 562 of the loading circuit 560 is coupled to the power terminal. The output terminal 564 of the loading circuit 560 is coupled to the ground terminal. The controller 500 is coupled to the output terminal 564 of the loading circuit 560.

Figure 6:
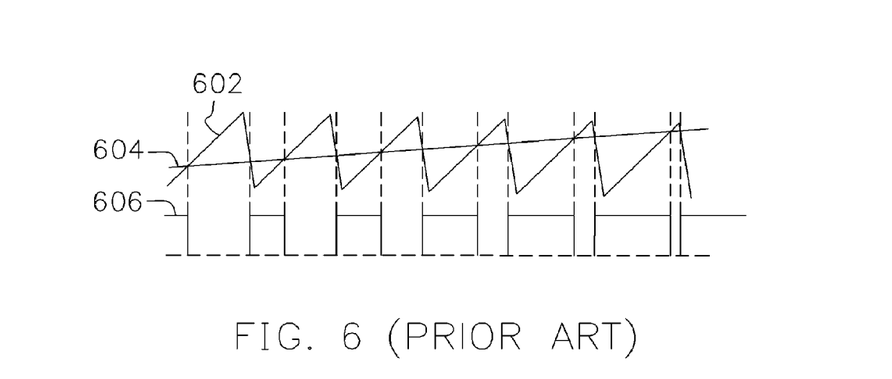
FIG. 6 is a schematic drawing showing a conventional triangle-wave generator outputting the triangle wave, the error signal and the pulse controlling signal.

The controller 500 comprises: a triangle-wave generator 510, an error amplifier 520, a comparator 530 and a driving circuit 540. A negative terminal of the error amplifier 520 is coupled to the output terminal 564 of the loading circuit 560 for receiving the feedback voltage therefrom. The positive terminal of the error amplifier 520 is coupled to a source of reference voltage. The positive terminal of the comparator 530 is coupled to the error amplifier 520, the negative terminal of the comparator 530 is coupled to the triangle-wave generator 510, and the output terminal of the comparator 530 is coupled to the driving circuit 540. FIG. 6 is a schematic drawing showing a conventional triangle-wave generator outputting the triangle wave, the error signal and the pulse controlling signal. The error amplifier 520 performs an error operation of the feedback voltage and the reference voltage for outputting an error signal 604 to the comparator 530. After the controller 500 is turned on, the triangle-wave generator 510 outputs a fixed-amplitude triangle wave 602 to the comparator 530. The comparator 530 compares the error signal 604 and the fixed-amplitude triangle wave 602 for outputting the driving signal. Finally, the driving circuit 540 outputs a pulse controlling signal 606 according to the driving signal.

In the loading system 50 in prior art, the switch 550 controls the power terminal to output electric power according to the pulse controlling signal from the comparator 530. When the switch 550 is turned on, the power is not transmitted to the loading circuit 560; if not, the power is transmitted to the loading circuit 560.

Accordingly, the conventional controller has the following disadvantages:

(1) In the conventional controller, because the width of the pulse controlling signal is modulated by the error of the feedback voltage and the reference voltage, noises in the feedback voltage will interfere with the width of the pulse controlling signal.

(2) The conventional controller with higher sensitivity generates a desired transient response for the loading system, but degrades the stability thereof.

(3) The conventional pulse modulator with lower sensitivity generates a desired stability of the loading system, but degrades the transient response thereof.

SUMMARY OF THE INVENTION

Therefore, an object of the present invention is to provide a loading system and a controller thereof, which are adapted to perform an operation according to the reference voltage and the feedback voltage for generating an amplitude-frequency adjustable triangle wave according to a variation of the feedback voltage.

Another object of the present invention is to provide a loading system and a controller thereof, which are adapted to use the amplitude-frequency adjustable triangle wave for improving a desired transient response.

The present invention provides a controller comprising an adjustable triangle wave generator, an error signal generator, a pulse signal generator, and a driving circuit. The adjustable triangle wave generator outputs a triangle wave and adjusts an amplitude and frequency of triangle wave according to an indicative signal indicating a condition of a loading circuit. The error signal generator performs an error operation according to the indicative signal and a reference voltage for outputting an error signal. The pulse signal generator is electrically coupled to the adjustable triangle wave generator and the error signal generator to receive and compare the error signal and the triangle wave for outputting a pulse controlling signal. The driving circuit is electrically coupled to the pulse signal generator to receive and transform the pulse controlling signal for outputting a driving signal.

According to the preferred embodiment of the present invention, the adjustable triangle-wave generator determines the amplitude and frequency of the triangle wave according to the difference between the feedback voltage and the reference voltage. When a difference between the feedback voltage and the reference voltage is higher than a transient determining voltage, the adjustable triangle-wave generator outputs a first amplitude and frequency of the amplitude-frequency adjustable triangle wave. When a difference between the feedback voltage and the reference voltage is lower than a transient determining voltage, the adjustable triangle-wave generator outputs a second amplitude and frequency of the amplitude-frequency adjustable triangle wave. When the feedback voltage is higher than, or equal to, the reference voltage (or a difference between the feedback voltage and the reference voltage is lower than a stable determining voltage), the adjustable triangle-wave generator outputs a third amplitude and frequency of the amplitude-frequency adjustable triangle wave.

According to the preferred embodiment of the present invention, the controller can be applied to a loading system comprising: a front-end circuit, a fly-back circuit, a boosting circuit, a buck circuit, a push-pull circuit, a half-bridge circuit, or a full-bridge circuit. In addition, a transforming circuit can be considered to be a boosting circuit or a buck circuit.

Because the present invention uses the adjustable triangle-wave generator for generating the amplitude-frequency adjustable triangle wave according to the feedback voltage and the reference voltage, the loading system reaches the stable state soon and has high stability.

In order to make the aforementioned and other objects, features and advantages of the present invention understandable, preferred embodiments accompanied with figures are described in detail below.

DESCRIPTION OF THE EMBODIMENTS

Figure 1:
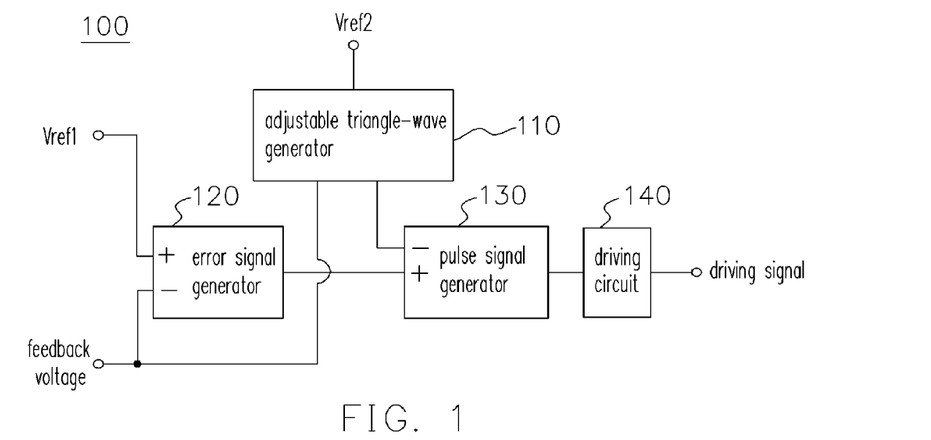
FIG. 1 is a block circuit diagram showing a controller according to a preferred embodiment of the present invention.

FIG. 1 is a block circuit diagram showing a controller according to a preferred embodiment of the present invention. Referring to FIG. 1, a controller 100 comprises: an adjustable triangle wave generator 110, and a driving signal generator that includes an error signal generator 120, a pulse signal generator 130, and a driving circuit 140. The adjustable triangle-wave generator 110 and the error signal generator 120 perform operations for the feedback voltage and the reference voltage. The pulse signal generator 130 is coupled to the adjustable triangle wave generator 110 and the error signal generators 20.

In the embodiment, the adjustable triangle wave generator 110 is adapted to perform an amplitude and frequency operation according to the reference voltage Vref2 and the feedback voltage for generating an amplitude-frequency adjustable triangle wave according to a variation of the feedback voltage. The error signal generator 120 is adapted to perform an error operation according to the feedback voltage and the reference voltage Vref1 for outputting an error signal. The pulse signal generator 130 is adapted to receive and compare the error signal and the amplitude-frequency adjustable triangle wave for outputting a driving signal. The driving circuit 140 is coupled to the pulse signal generator 130 for generating a pulse controlling signal as to control the switch of the loading system. The reference voltages Vref1 and Vref2 could be the same or different reference voltage, i.e., the adjustable triangle wave generator 110, an error signal generator 120 could receive the same reference voltage.

The present invention adjusts the amplitude and frequency of the triangle wave according to the reference voltage and the feedback voltage, so the amplitude and frequency of the triangle wave is adjusted by the actual condition of loading for improving the transient response, reducing the responsive time of achieving the stable status. Moreover, the present invention also prevents from exceeding the desired range during the loading system being in the transient status, and improves the stability of the loading system in the stable status.

Figure 2A:
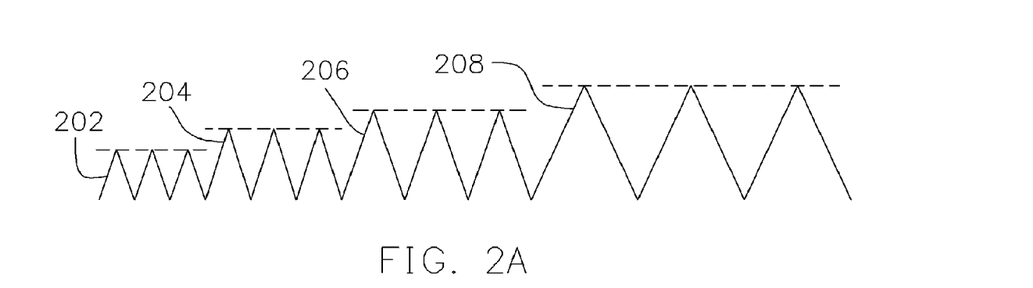
FIG. 2A is schematic drawings showing the discrete amplitude-frequency adjustable triangle wave from an adjustable triangle-wave generator according to a first embodiment of the present invention.
Figure 2B:
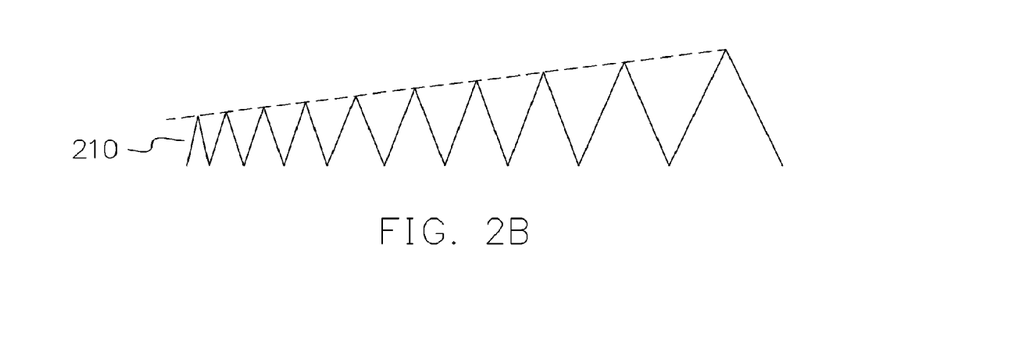
FIG. 2B is schematic drawings showing the continuous amplitude-frequency adjustable triangle wave from the adjustable triangle-wave generator according to the first embodiment of the present invention.

FIG. 2A is schematic drawings showing the discrete amplitude-frequency adjustable triangle wave from the adjustable triangle wave generator of the first embodiment of the present invention. FIG. 2B is schematic drawings showing the continuous amplitude-frequency adjustable triangle wave from the adjustable triangle wave generator according to the first embodiment of the present invention.

In the embodiment, the controller 100 controls the adjustable triangle wave generator 110 for generating small amplitude and higher frequency triangle waves 202 or 204 shown in FIG. 2A when the adjustable triangle wave generator 110 identifies that the difference between the feedback voltage and the reference voltage is higher than a transient determining voltage.

In the embodiment, when the adjustable triangle wave generator 110 identifies that the difference between the feedback voltage and the reference voltage is lower than a transient determining voltage or is reduced (e.g.: the loading is triggered), the adjustable triangle wave generator 110 outputs larger amplitude and lower frequency triangle waves 204 or 206 than the originals shown in FIG. 2A.

In the embodiment, when the adjustable triangle wave generator 110 identifies that the feedback voltage is higher, or equal to, the reference voltage, or the difference between the feedback voltage and the reference voltage is smaller than a predetermined value, the adjustable triangle wave generator 110 generates large and low triangle waves 206 or 208 as shown in FIG. 2A. In addition, the adjustable triangle wave generator 110 can continuously adjust the amplitude of the triangle waves 210 shown in FIG. 2B. Of course, the present invention is not limited thereto.

Hence, the present invention could restrain the output of the loading system from a range of exceeding a desired value and improve the stability of the loading system in the stable status. Of course, the amplitude and frequency of the triangle wave in the present invention is not limited to these embodiments. For example, a loading system requires a lower amplitude and frequency (or amplitude and frequency in a specific range) during starting process, and the adjustable triangle wave generator provides a triangle wave with suitable amplitude and frequency to meet the requirement whiling determining that is in the starting status according to the feedback voltage and the reference voltage and then provides a triangle wave with lower amplitude and a higher frequency whiling in the transient status for reducing the transient time. Therefore, the present invention could set with different determining conditions and provides a triangle wave with suitable frequency and amplitude according to the determining conditions.

Figure 3:
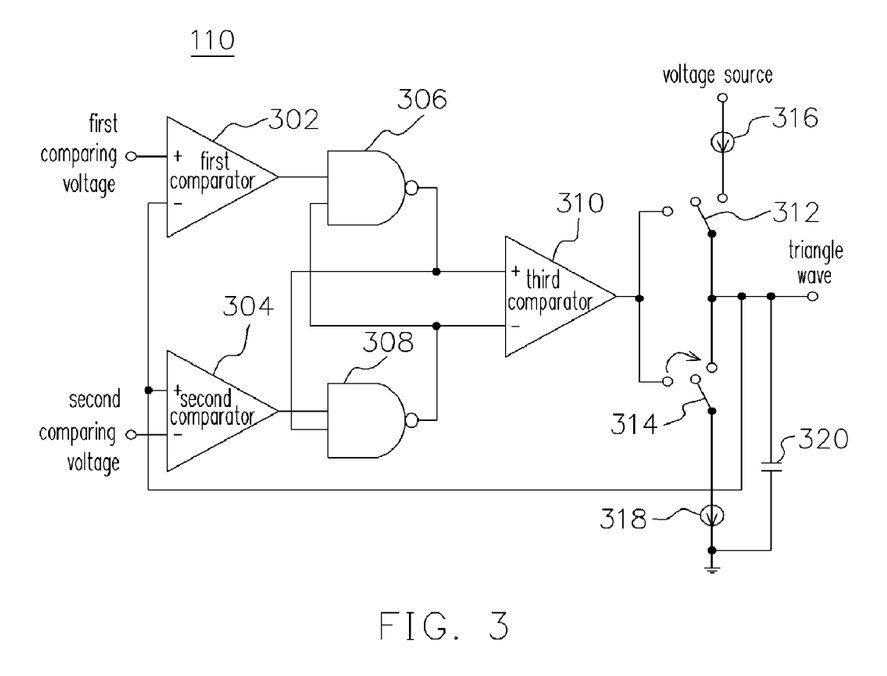
FIG. 3 is a circuit diagram showing an adjustable triangle-wave generator according to a preferred embodiment of the present invention.

FIG. 3 is a circuit diagram showing an adjustable triangle wave generator according to a preferred embodiment of the present invention. In the embodiment, the adjustable triangle wave generator 100 is illustrated. The present invention, however, is not limited thereto. The adjustable triangle wave generator 110 comprises a first comparator 302, a second comparator 304, NAND gates 306 and 308, a third comparator 310, switches 312 and 314, a charging current source 316, a discharging current source 318 and a capacitor 320.

In the embodiment, when it is in a charging status, the third comparator 310 turns off the switch 312 for charging the capacitor 320 by the charging current source 316. The voltage level of the triangle wave generated by the adjustable triangle wave generator 110 is increased. When the voltage level of the triangle wave is higher than a first comparing voltage VH, the output voltage of the first comparator 302 is down to a voltage representing "0" state. The output voltage of the NAND gate 306 rises to a voltage representing "1" state. Because the voltage level of the triangle wave is higher than a second comparing voltage VL during the charging process, the output voltage of the second comparator 304 is kept at "1" state. Because the two inputs of the NAND gate 308, the output of the NAND gate 306 and the output of the second comparator 304 are all in "1" state, the output of the NAND gate 308 will be "0" state. Therefore, the positive terminal of the third comparator 310 has a higher state than that of the negative terminal thereof. The output terminal of the third comparator 310 rises to "1" state for turning off the switch 312 to terminate the charging of the capacitor 320 from the charging source 316. The charging process is complete.

In the embodiment, when it is in a discharging status, the third comparator 310 turns on the switch 314 for discharging the capacitor 320 by the discharging source 318. The voltage level of the triangle wave from the adjustable triangle wave generator 110 is decayed. When the voltage level of the triangle wave is lower than the second comparing voltage VL, the output voltage of the second comparator 304 is down to a voltage representing a "0" state. The output voltage of the NAND gate 308 rises to a voltage representing "1" state. Because the voltage level of the triangle wave is lower than the first comparing voltage VH during the discharging process, the output voltage of the first comparator 302 is kept at "1" state. Because the two inputs of the NAND gate 306, the output of the NAND gate 308 and the output of the first comparator 302 are all in "1" state, the output of the NAND gate 306 will be "0" state. Therefore, the positive terminal of the third comparator 310 has a lower state than that of the negative terminal thereof. The output terminal of the third comparator 310 is down to "0" state for turning off the switch 314 to terminate the discharging of the capacitor 320 from the discharging terminal 318. The discharging process is complete.

In the embodiment, the charging source 316 and the discharging source 318 are constant current source. When the difference between the feedback voltage and the reference voltage is large, the first comparing voltage VH of the first comparator 302 is a small voltage. The difference voltage between the first comparing voltage VH and the second comparing voltage VL is small. Then, the adjustable triangle wave generator 110 generates a small amplitude and high frequency triangle wave.

In the embodiment, when the difference between the feedback voltage and the reference voltage is reduced, the first comparing voltage VH of the first comparator 302 is enhanced. Then, the adjustable triangle wave generator 110 generates a progressively large amplitude triangle wave.

In the embodiment, when the feedback voltage is close to the reference voltage, the first comparing voltage VH of the first comparator 302 reaches a maximum. Then, the a adjustable triangle wave generator 110 generates a maximum amplitude and minimum frequency triangle wave.

Figure 4A:
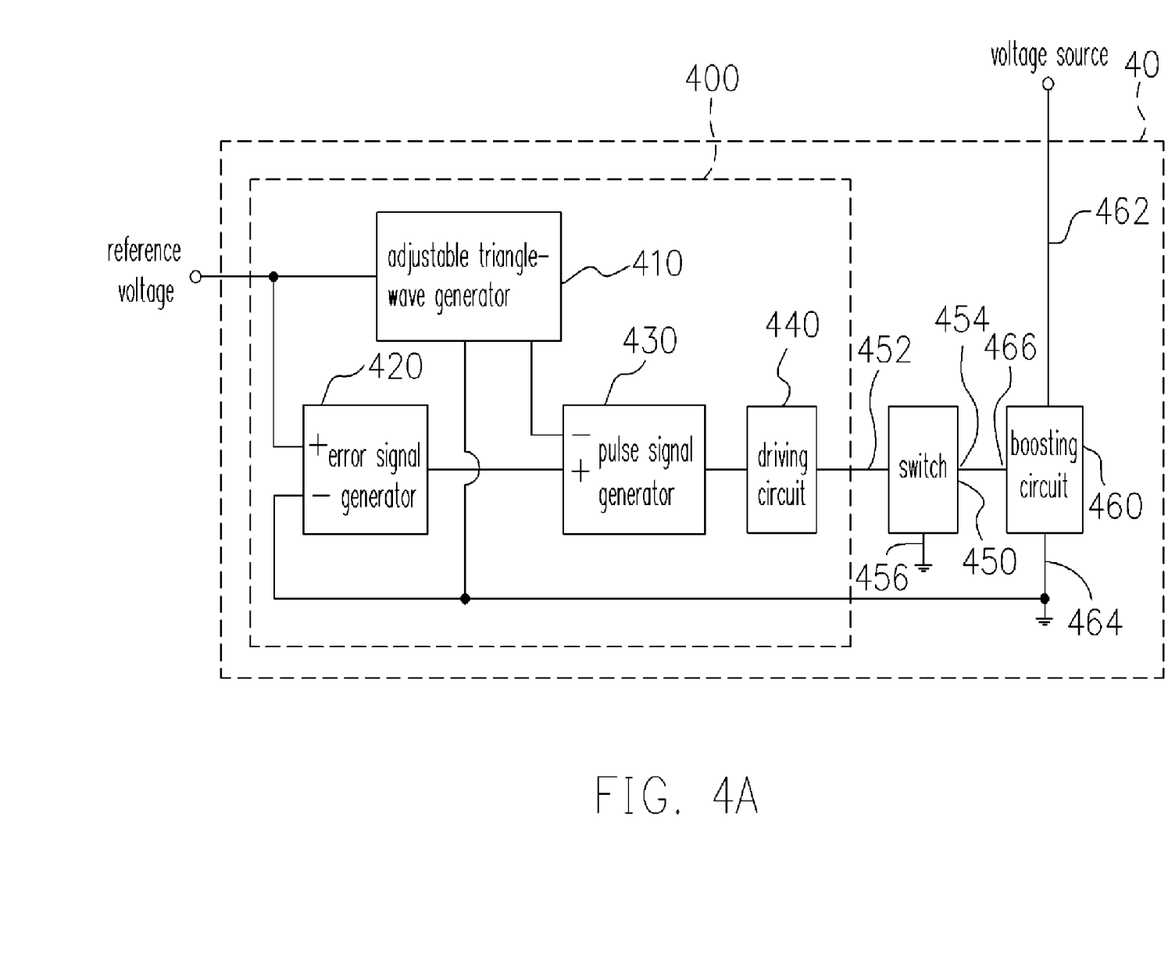
FIG. 4A is a circuit diagram showing a boosting circuit applying an adjustable triangle-wave generator according to a preferred embodiment of the present invention.

FIG. 4A is a circuit diagram showing a boosting circuit applying an adjustable triangle wave generator according to a preferred embodiment of the present invention. In the embodiment, the loading system 40 is coupled to a power terminal, comprising a controller 400, a switch 450 and the boosting circuit 460.

In the embodiment, the boosting circuit 460 has an input terminal 462 coupled to the power terminal, an output terminal 464, and a controlled terminal 466I controlled by the switch 450 for selectively receiving an operational voltage from the power terminal. The controller 400 is coupled to the output terminal 464 of the boosting circuit 460, comprising: an adjustable triangle wave generator 410, an error signal generator 420, a pulse signal generator 430 and a driving circuit 440. The switch 450 has a first terminal 452 coupled to the driving circuit 440, a second terminal 454 coupled to the boosting circuit 460, and a third terminal 456 coupled to a ground terminal for controlling the switch 450 according to the driving signal.

The adjustable triangle wave generator 410 is adapted to receive a feedback voltage from the boosting circuit 460 and to perform an amplitude and frequency operation according to a reference voltage and the feedback voltage for generating an amplitude-frequency adjustable triangle wave according to a variation of the feedback voltage. The error signal generator 420 is adapted to perform an error operation according to the feedback voltage and the reference voltage for outputting an error signal. The pulse signal generator 430 is coupled to the adjustable triangle wave generator 410 and the error signal generator 420, and adapted to receive and compare the error signal and the amplitude-frequency adjustable triangle wave for outputting a pulse controlling signal. The driving circuit 440 is coupled to the pulse signal generator and adapted to receive and transform the pulse generating signal for outputting a driving signal to the switch 450.

In the embodiment, when the switch 450 is turned off, the power terminal applies the operational voltage to the boosting circuit 460; when the switch 450 is turned on, the power terminal does not apply the operational voltage to the boosting circuit 460. The adjustable triangle wave generator 410 is adapted to perform an amplitude and frequency operation according to the reference voltage and the feedback voltage from the output terminal 464 of the boosting circuit 460.

When the difference of the feedback voltage and the reference voltage is higher than the transient determining voltage, the boosting circuit is turned on. The adjustable triangle wave generator 410 outputs a first amplitude and frequency of the amplitude-frequency adjustable triangle wave.

When the difference between the feedback voltage and the reference voltage is lower than the transient determining voltage, the adjustable triangle wave generator 410 outputs a progressively large second amplitude and second low frequency of the amplitude-frequency adjustable triangle wave.

When the feedback voltage is higher than, or equal to, the reference voltage (or the difference between the feedback voltage and the reference voltage is lower than a stable determining voltage), the boosting circuit 460 is in a stable state (or will enter a stable state). The adjustable triangle wave generator 410 outputs a third amplitude and frequency of the amplitude-frequency adjustable triangle wave.

Figure 4B:
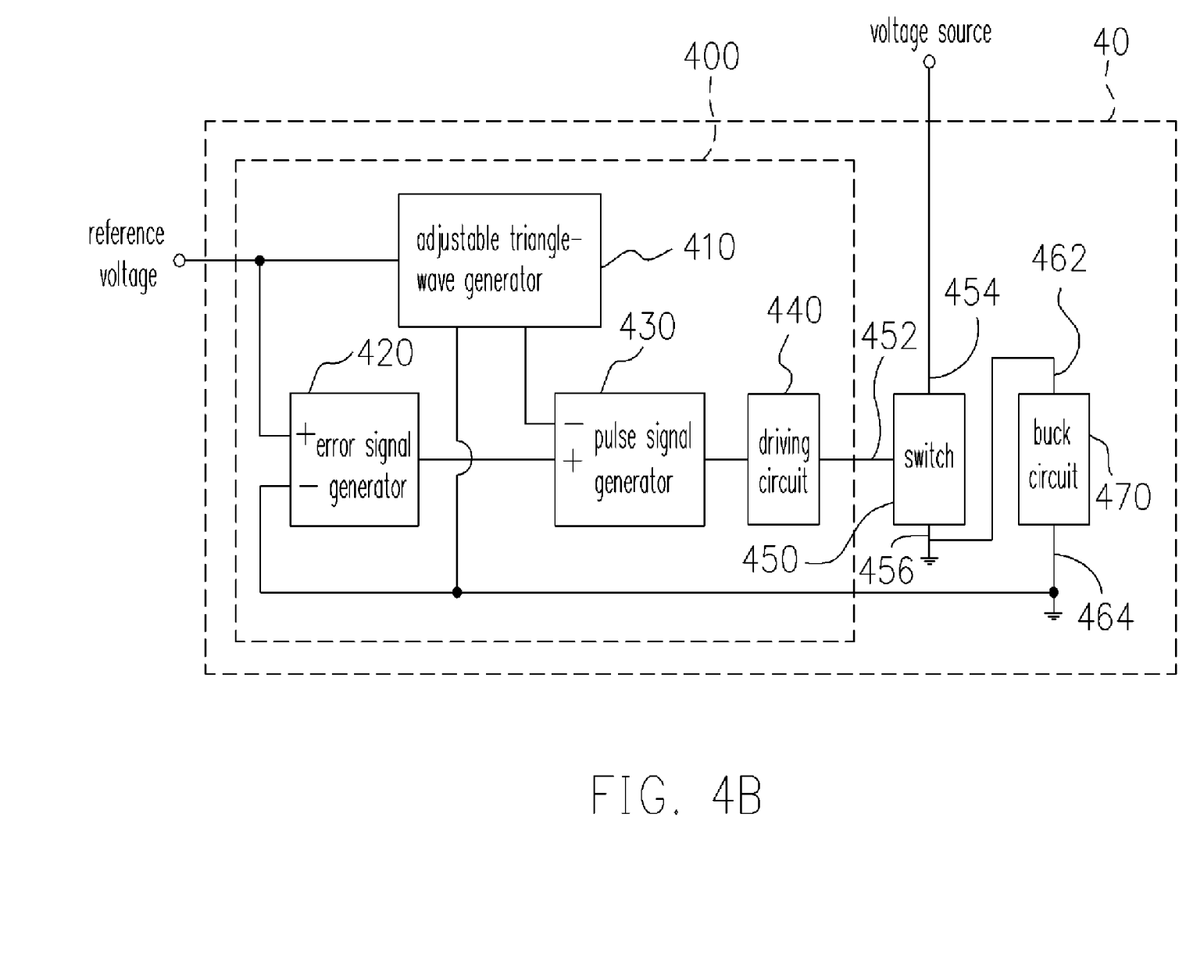
FIG. 4B is a circuit diagram showing a buck circuit applying an adjustable triangle-wave generator according to a preferred embodiment of the present invention.

FIG. 4B is a circuit diagram showing a preferred buck circuit applying an adjustable triangle wave generator of the present invention. Compared with FIG. 4A, the embodiment substitutes the buck circuit 470 for the boosting circuit 460. The structure and the operation of FIG. 4B are similar to those of FIG. 4A.

Figure 4C:
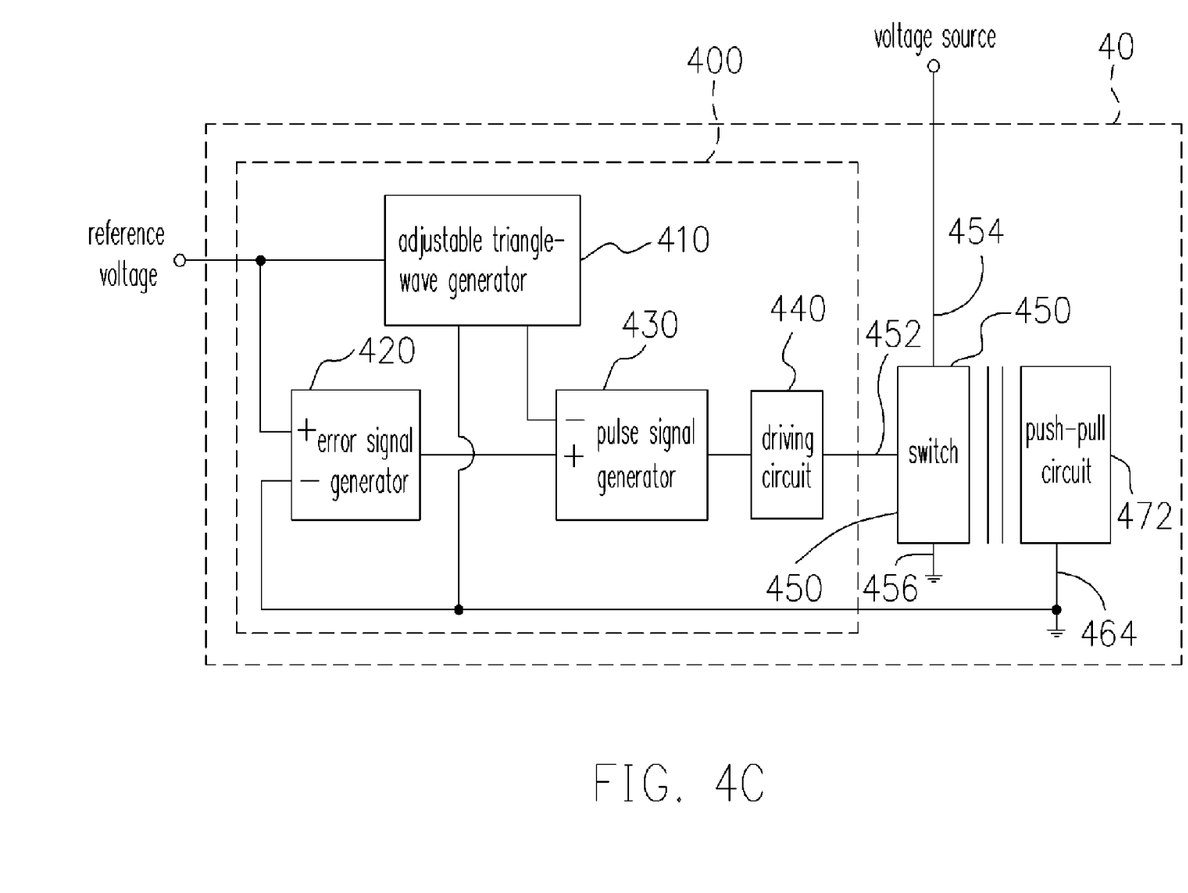
FIG. 4C is a circuit diagram showing a push-pull circuit applying an adjustable triangle-wave generator according to a preferred embodiment of the present invention.

FIG. 4C is a circuit diagram showing a push-pull circuit applying an adjustable triangle wave generator according to a preferred embodiment of the present invention. Compared with FIG. 4A, the push-pull circuit is not coupled to the power terminal. It generates induced current when the switch 450 is turned on. The operation of the controller 400 of the embodiment is similar to that of FIG. 4A.

Figure 4D:
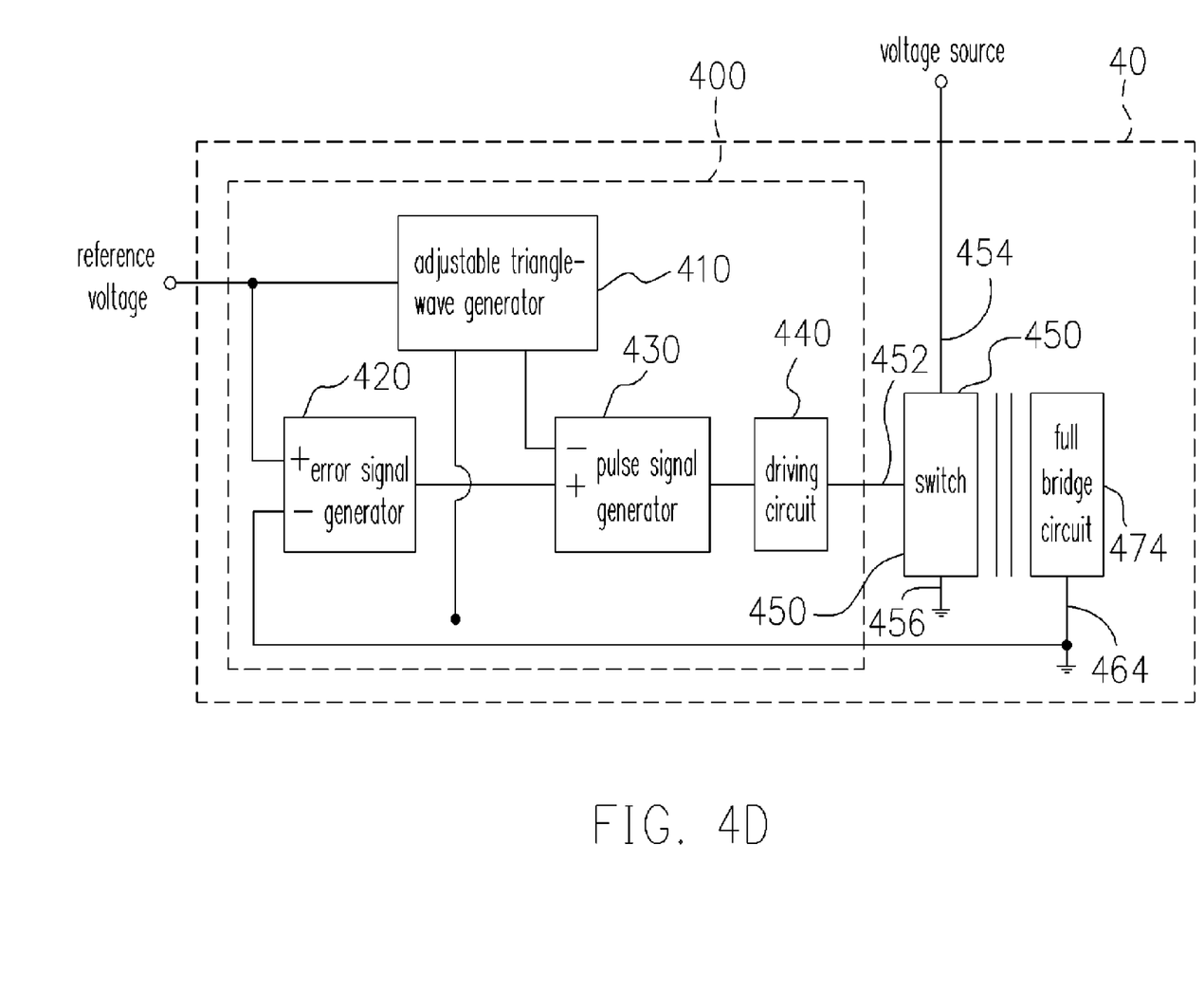
FIG. 4D is a circuit diagram showing a full-bridge circuit applying an adjustable triangle-wave generator according to a preferred embodiment of the present invention.
Figure 4E:
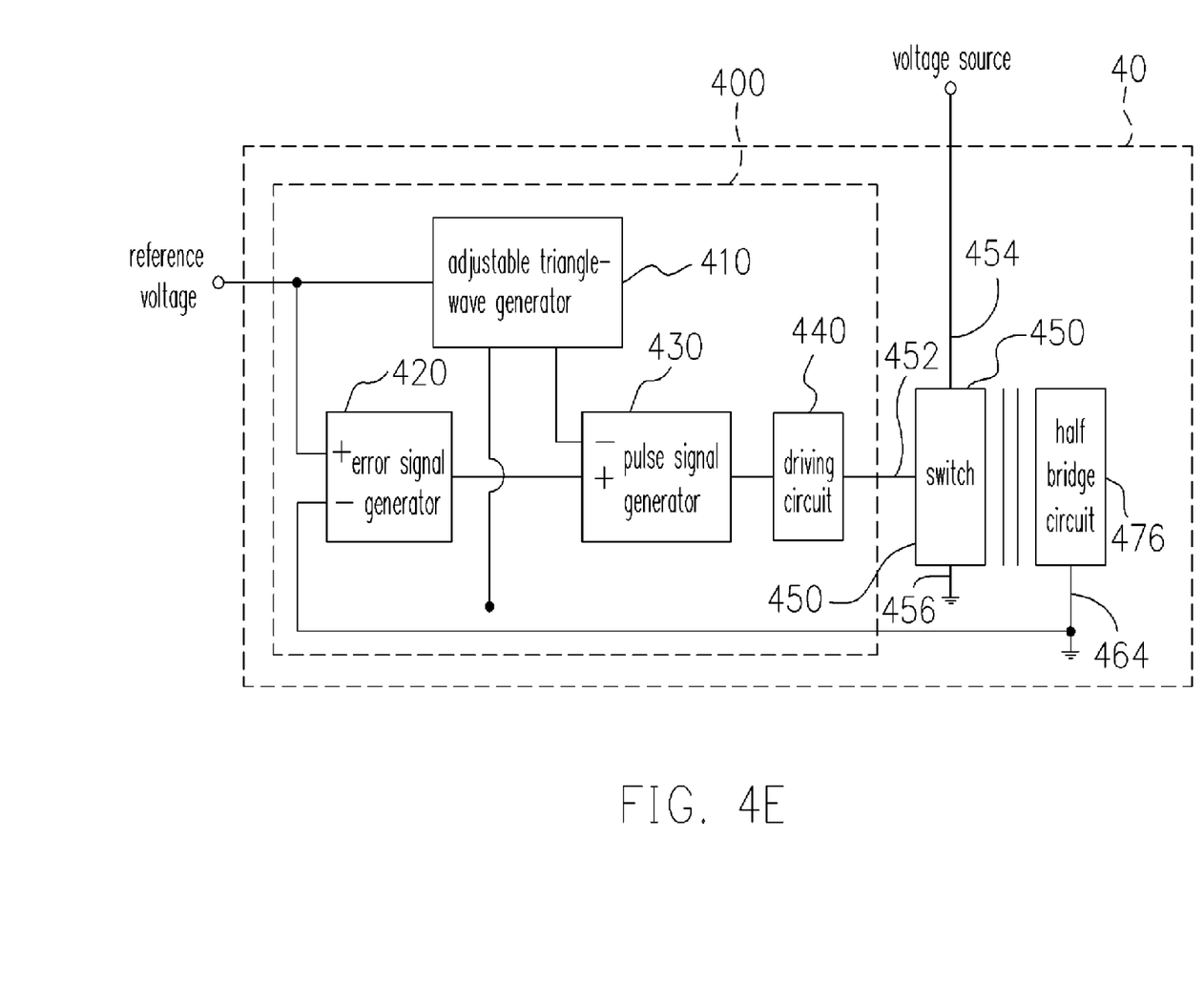
FIG. 4E is a circuit diagram showing a half-bridge circuit applying an adjustable triangle-wave generator according to a preferred embodiment of the present invention.

FIG. 4D is a circuit diagram showing a full-bridge circuit applying an adjustable triangle wave generator according to a preferred embodiment of the present invention. FIG. 4E is a circuit diagram showing a half-bridge circuit applying an adjustable triangle wave generator according to a preferred embodiment of the present invention.

Compared with FIG. 4C, the embodiment of FIG. 4D substitutes the full-bridge circuit 474 for the push-pull circuit 472 and has the operation similar to that of FIG. 4C.

Compared with FIG. 4C, the embodiment of FIG. 4E substitutes the half-bridge circuit 476 for the push-pull circuit 472 and has the operation similar to that of FIG. 4C.

In the embodiments of the present invention, the loading circuit does not necessarily go through the original state, transient state and the stable state. It illustrates some possible situations, but not limited thereto.

In a preferred embodiment of the present invention, the error signal generator 120 can be, for example, an error integrator.

In a preferred embodiment of the present invention, the pulse signal generator 130 can be, for example, a comparator.

In a preferred embodiment of the present invention, the transient state varies depending on the design of the loading circuit 150.

In a preferred embodiment of the present invention, the reference voltage can be generated from a reference voltage generator (not show) depending on the design of the circuit.

In a preferred embodiment of the present invention, the loading system can be, for example, a front-end circuit or a fly-back circuit applying the adjustable triangle wave generator, but not limited thereto.

Accordingly, the controller and the loading system thereof have following advantages:

(1) The controller and the loading system thereof of the present invention use error integrator, instead of the error amplifier, for preventing noise.

(2) The controller and the loading system thereof of the present invention use the adjustable triangle wave generator for improving the transient response thereof.

(3) The controller and the loading system thereof of the present invention have a desired stability according to the timing factors for setting the transient response.

(4) The controller and the loading system thereof of the present invention can substantially prevent the response of the loading system over the target.

(5) The controller and the loading system thereof of the present invention can reduce the responsive time thereof.

(6) The controller and the loading system thereof of the present invention can be integrated in a chip.

Although the present invention has been described in terms of exemplary embodiments, it is not limited thereto. Rather, the appended claims should be constructed broadly to include other variants and embodiments of the invention, which may be made by those skilled in the field of this art without departing from the scope and range of equivalents of the invention.

What is claimed is:

1. A controller, comprising:
   an adjustable triangle wave generator, outputting a triangle wave and adjusting an amplitude and frequency of triangle wave according to an indicative signal indicating a condition of a loading circuit;
   an error signal generator, performing an error operation according to the indicative signal and a reference voltage for outputting an error signal;
   a pulse signal generator, electrically coupled to the adjustable triangle wave generator and the error signal generator, receiving and comparing the error signal and the triangle wave for outputting a pulse controlling signal; and
   a driving circuit, electrically coupled to the pulse signal generator, receiving and transforming the pulse controlling signal for outputting a driving signal.

2. The controller of claim 1, wherein the adjustable triangle wave generator further generates two amplitude comparing voltages according to the reference voltage for determining the peak and valley of the triangle wave.

3. The controller of claim 2, wherein the adjustable triangle wave generator generates triangle wave with a first amplitude and a first frequency while a difference between a voltage of the indicative signal and the reference voltage is larger than a transient determining voltage.

4. The controller of claim 3, wherein the adjustable triangle wave generator generates triangle wave with a second amplitude and a second frequency while a difference between a voltage of the indicative signal and the reference voltage is lower than a transient determining voltage.

5. The controller of claim 4, wherein the second amplitude is a progressively large amplitude and the second frequency is a progressively low frequency.

6. The controller of claim 4, wherein the adjustable triangle wave generator generates triangle wave with a third amplitude and a third frequency while a difference between a voltage of the indicative signal and the reference voltage is lower than a stable determining voltage.

7. A loading system, electrically coupled to a power source, the loading system comprising:
   a controller, comprising:
     an adjustable triangle wave generator, receiving an indicative signal indicating a condition of a loading and a reference voltage, and performing an operation according to the indicative signal and the reference voltage for outputting a triangle wave with an amplitude and frequency adjusted in accordance to a variation of the indicative signal; and
     a driving signal generator, electrically coupled to the adjustable triangle wave generator and outputting a driving signal according to the indicative signal and the triangle wave;

a switch, electrically coupled to the controller and performing a switch operation according to the driving signal; and a transforming circuit, electrically coupled to the switch, and transforming the electric power of the power source to output to the loading corresponding to the switch operation of the switch.

8. The loading system of claim 7, wherein the transforming circuit is a boosting circuit or a buck circuit.

9. The loading system of claim 7, wherein the adjustable triangle wave generator further generates two amplitude comparing voltages according to the reference voltage for determining the peak and valley of the triangle wave.

10. The loading system of claim 7, wherein the adjustable triangle wave generator generates triangle wave with a first amplitude and a first frequency while a difference between a voltage of the indicative signal and the reference voltage is larger than a transient determining voltage.

11. The loading system of claim 10, wherein the adjustable triangle wave generator generates triangle wave with a second amplitude and a second frequency while a difference between a voltage of the indicative signal and the reference voltage is lower than a transient determining voltage.

12. The loading system of claim 11, wherein the second amplitude is a progressively large amplitude and the second frequency is a progressively low frequency.

13. The loading system of claim 11, wherein the adjustable triangle wave generator generates triangle wave with a third amplitude and a third frequency while a difference between a voltage of the indicative signal and the reference voltage is lower than a stable determining voltage.

14. A loading system, electrically coupled to a power source, the loading system comprising:
a controller, comprising:
an adjustable triangle wave generator, receiving an indicative signal indicating a condition of a loading and a reference voltage, and performing an operation according to the indicative signal and the reference voltage for outputting a triangle wave with an amplitude and frequency adjusted in accordance to a variation of the indicative signal; and
a driving signal generator, electrically coupled to the adjustable triangle wave generator and outputting a driving signal according to the indicative signal and the triangle wave;
a switch having a first terminal, a second terminal, and a third terminal, wherein the first terminal electrically is coupled to the controller for controlling the power source to output a electric power, the second terminal is electrically coupled to the power source, and the third terminal is electrically coupled to a ground; and
a transforming circuit having a input terminal and an output terminal, wherein the input terminal is electrically coupled to the switch for receiving and transforming the electric power, and the output terminal is electrically coupled to the loading.

15. The loading system of claim 14, wherein the transforming circuit is a boosting circuit or a buck circuit.

16. The loading system of claim 14, wherein the adjustable triangle wave generator further generates two amplitude comparing voltages according to the reference voltage for determining the peak and valley of the triangle wave.

17. The loading system of claim 14, wherein the adjustable triangle wave generator generates triangle wave with a first amplitude and a first frequency while a difference between a voltage of the indicative signal and the reference voltage is larger than a transient determining voltage.

18. The loading system of claim 17, wherein the adjustable triangle wave generator generates triangle wave with a second amplitude and a second frequency while a difference between a voltage of the indicative signal and the reference voltage is lower than a transient determining voltage.

19. The loading system of claim 18, wherein the second amplitude is a progressively large amplitude and the second frequency is a progressively low frequency.

20. The loading system of claim 18, wherein the adjustable triangle wave generator generates triangle wave with a third amplitude and a third frequency while a difference between a voltage of the indicative signal and the reference voltage is lower than a stable determining voltage.

21. An adjustable triangle wave generator, comprising:
a capacitor, for generating a triangle wave signal;
a current source circuit, for charging and discharging the capacitor;
a reference voltage generator, generating two comparing voltages according to a condition signal; and
a controller, determining an amplitude of the triangle wave according to the comparing voltages;
wherein the amplitude and frequency of the triangle wave are determined by the comparing voltages and the rates of charging and discharging.

22. The adjustable triangle wave generator of claim 21, wherein the condition signal is for indicating a condition of a loading.

23. The adjustable triangle wave generator of claim 22, wherein the charging current and the discharging current of the current source circuit are constant.

24. The adjustable triangle wave generator of claim 22, wherein the current source circuit adjusts the rates of charging and discharging for the capacitor according to the condition signal.

25. The adjustable triangle wave generator of claim 22, wherein the reference voltage generator further generates at least one determining voltage, and the controller generates the two comparing voltage according to the determining voltage.

26. The adjustable triangle wave generator of claim 25, wherein the current source circuit determines the rates of charging and discharging for the capacitor according to the least one determining voltage.

* * * * *